United States Patent
Nakayama et al.

(10) Patent No.: US 7,969,046 B2
(45) Date of Patent: Jun. 28, 2011

(54) POWER SUPPLY CONTROL APPARATUS

(75) Inventors: Masashi Nakayama, Shizuoka (JP);
Shigemi Ishima, Shizuoka (JP);
Kazuhiro Aoki, Aichi (JP); Akihito Tsukamoto, Aichi (JP)

(73) Assignees: Yazaki Corporation, Tokyo (JP);
Toyota Jidosha Kabushiki Kaisha, Toyota-Shi (JP)

( * ) Notice: Subject to any disclaimer, the term of this patent is extended or adjusted under 35 U.S.C. 154(b) by 167 days.

(21) Appl. No.: 12/200,997

(22) Filed: Aug. 29, 2008

(65) Prior Publication Data
US 2009/0096293 A1 Apr. 16, 2009

(30) Foreign Application Priority Data

Sep. 5, 2007 (JP) ................ 2007-230215

(51) Int. Cl.
*H01H 9/54* (2006.01)
*H01H 33/59* (2006.01)
*H01H 47/00* (2006.01)
*H01H 85/46* (2006.01)

(52) U.S. Cl. ......... 307/140; 307/9.1; 307/127; 307/139; 361/84; 361/92; 324/500; 324/501; 324/502; 324/503; 324/506; 324/508; 324/509; 324/511; 324/512; 324/537; 324/555; 340/649

(58) Field of Classification Search .......... 234/500–556; 340/649
See application file for complete search history.

(56) References Cited

U.S. PATENT DOCUMENTS 5,391,948 A * 2/1995 Izumita .................. 327/310
5,805,396 A * 9/1998 Sado et al. ............... 361/42
2003/0160517 A1 * 8/2003 Lo et al. .................. 307/140
2004/0004404 A1 * 1/2004 Eckardt et al. .......... 307/140
2004/0228053 A1 * 11/2004 Thiery et al. ........... 361/84

(Continued)

FOREIGN PATENT DOCUMENTS
JP 6-90520 3/1994
(Continued)

OTHER PUBLICATIONS

JP Pg-pub 2007-019812 to Oshima—english translation, Jan. 25, 2007.*

(Continued)

*Primary Examiner* — Jared J Fureman
*Assistant Examiner* — Justen Fauth
(74) *Attorney, Agent, or Firm* — Kratz, Quintos & Hanson, LLP

(57) ABSTRACT

The present invention is to provide a power supply control apparatus which can connect a ground to a suitable electric potential when the ground is disconnected. The power supply control apparatus includes a control circuit having a switch element and a switch control unit, and a load. One terminal of load is connected to a direct-current power supply through the switch element, and the other terminal is connected to a ground electric potential. The switch control unit has a ground terminal connected to the ground electric potential and outputting a ground current flowing toward the ground electric potential. The control circuit includes a bypass device having a load side bypass system for passing the ground current to the ground electric potential through the load when connection between the ground terminal and the ground electric potential is disconnected. The load includes impedance for changing the electric potential of ground terminal into an electric potential in which the switch control unit stably acts when the ground current flows.

2 Claims, 6 Drawing Sheets

U.S. PATENT DOCUMENTS

2005/0162022 A1* 7/2005 Allard .................... 307/140
2007/0052300 A1* 3/2007 Chen ..................... 307/140

FOREIGN PATENT DOCUMENTS

| JP | 06090520 | * | 3/1994 |
| JP | 8-78095 | | 3/1996 |
| JP | 2004-148869 A1 | | 5/2004 |

OTHER PUBLICATIONS

JP Pg-pub 2001-148294 to Sato—english translation, May 29, 2001.*

JP Pg-pub 2004-148869 to Yabe—english translation, May 27, 2004.*

JP Patent 08-228435 to Otsuji—english translation, Sep. 3, 1996.*

* cited by examiner

POWER SUPPLY CONTROL APPARATUS

The priority application Number Japan Patent Application No. 2007-230215 upon which this patent application is based is hereby incorporated by reference.

BACKGROUND OF THE INVENTION

1. Field of the Invention

The present invention relates to a power supply control apparatus for controlling power supply connection and power supply disconnection to a load.

2. Description of the Related Art

In an electronic circuit formed from discrete semiconductor parts, IC (Integrated Circuit) and so on, the electronic circuit is designed based on connecting a power supply and a ground to a normal electric potential. For example, when only the power supply of electronic circuit is connected to a electric potential of power supply and the ground is nowhere connected (that is, non-connection condition of ground), action of this electronic circuit becomes unstable. Specially, in an electric circuit mounted on a power supply control apparatus, when an unexpected high-current by the unstable action flows into the electronic circuit, elements of electronic circuit are destroyed. As a result, there is a possibility that the electronic circuit becomes a dangerous state such as ignition. Therefore, in the patent document 1, an earth connecting mechanism for avoiding the above unsteady action is proposed.

According to the patent document 1, when a power feeding side connector and a power incoming side connector are connected, an earth terminal is connected before a power supply terminal is connected. Thereby, in an electronic circuit arranged after the power incoming side connector, the non-connection state of ground is not caused. Furthermore, the power supply and the earth are connected by a pair of connector. Therefore, when the connector comes off, the power supply and the earth come off at the same time. Thereby, in an electronic circuit connecting a power supply and an earth to each separate connecter, the earth side connector holds a connected state. In addition, the non-connection state of ground is not caused. By using the above mentioned earth connecting mechanism of electric connector, generation of non-connection state of ground is prevented, and unsteady action state of electric circuit is avoided.

Patent Documents 1

Japan published patent application H08-78095

SUMMARY OF THE INVENTION

Objects to be Solved

However, the above mentioned earth connecting mechanism of the patent document 1 prevents a non-connection state of ground which is caused when an electric connector is connected and disconnected. Therefore, the earth connecting mechanism can not prevent non-connection state of ground which is caused when an earth wire connected to an earth terminal of power feeding side connector is disconnected. Furthermore, as a result, in this case, destruction of circuit element or ignition of apparatus may occur.

Consequently, the present invention provides a power supply control apparatus which can connect a ground of electronic circuit to a suitable electric potential when a ground connection of electric circuit is disconnected.

How to Attain the Object of the Present Invention

According to a first aspect of the present invention, a power supply control apparatus includes a control circuit and a load. The control circuit has a switch element opening and closing a circuit by a switch signal and a switch control unit outputting the switch signal. The load connects one terminal to a DC (direct-current) power supply through the switch element and connecting another terminal to a ground electric potential. The switch control unit has a ground terminal connected to the ground electric potential and outputting a ground current flowing toward the ground electric potential. The control circuit has a bypass device including a load side bypass system for applying the ground current to the ground electric potential through the load when connection between the ground terminal and the ground electric potential is disconnected. The load has impedance for changing the electric potential of the ground terminal into an electric potential in which the switch control unit stably acts when the ground current flows.

According to a second aspect of the present invention, the control circuit has a control signal wire connected to the ground electric potential when the switch element closes. The bypass device has a signal side bypass system for applying the ground current to the ground electric potential through the control signal wire when the connection between the ground terminal and the ground electric potential is disconnected and the switch element closes. The load side bypass system applies the ground current to the ground electric potential through the load when the connection between the ground terminal and the ground electric potential is disconnected and the switch element opens According to a third aspect of the present invention, the bypass device has a reverse current preventive system. The reverse current preventive system always closes a circuit so as to apply a current to the load when the bypass device is connected to the load side bypass system in series and the DC power supply is normally connected, and the reverse current preventive system always opens the circuit so as to prevent the current from flowing into the load side bypass system when the DC power supply is connected in reverse.

Effect of the Invention

According to the invention, when connection between a ground terminal of switch control unit and a ground electric potential is disconnected, the ground terminal of switch control unit is connected to an electric potential in which the switch control unit stably acts. Thereby, a non-connection state is not caused in a control circuit. Furthermore, it is possible to prevent unsteady action of control circuit. Therefore, destruction of circuit element or ignition of apparatus can be prevented.

According to the invention, the ground terminal of switch control unit and the ground electric potential are connected through a control signal wire when a switch element closes. That is, the ground terminal of switch control unit is connected to the ground electric potential through a control signal wire when a DC (direct-current) power supply is connected to a load. Thereby, although the electric potential increases by connecting the DC power supply to the load, the ground terminal of switch control unit can be connected to the ground electric potential through the control signal wire. Therefore, it is securely possible to prevent unstable action of control circuit. As a result, destruction of circuit element or ignition of apparatus can be avoided.

According to the invention, the bypass device has a reverse current preventive system. Thereby, when the DC power supply is mistakenly connected in reverse, a short path of DC power supply is not formed by virtue of the bypass device. Therefore, the power supply control apparatus of the present invention can prevent damage of apparatus by short, and can provide a more safe power supply control apparatus.

The above and other objects and features of this invention will become more apparent from the following description taken in conjunction with the accompanying drawings.

DESCRIPTION OF THE PREFERRED EMBODIMENT

In the following, first embodiment of the present invention is explained with reference to FIGS. 1 and 2.

Figure 1:
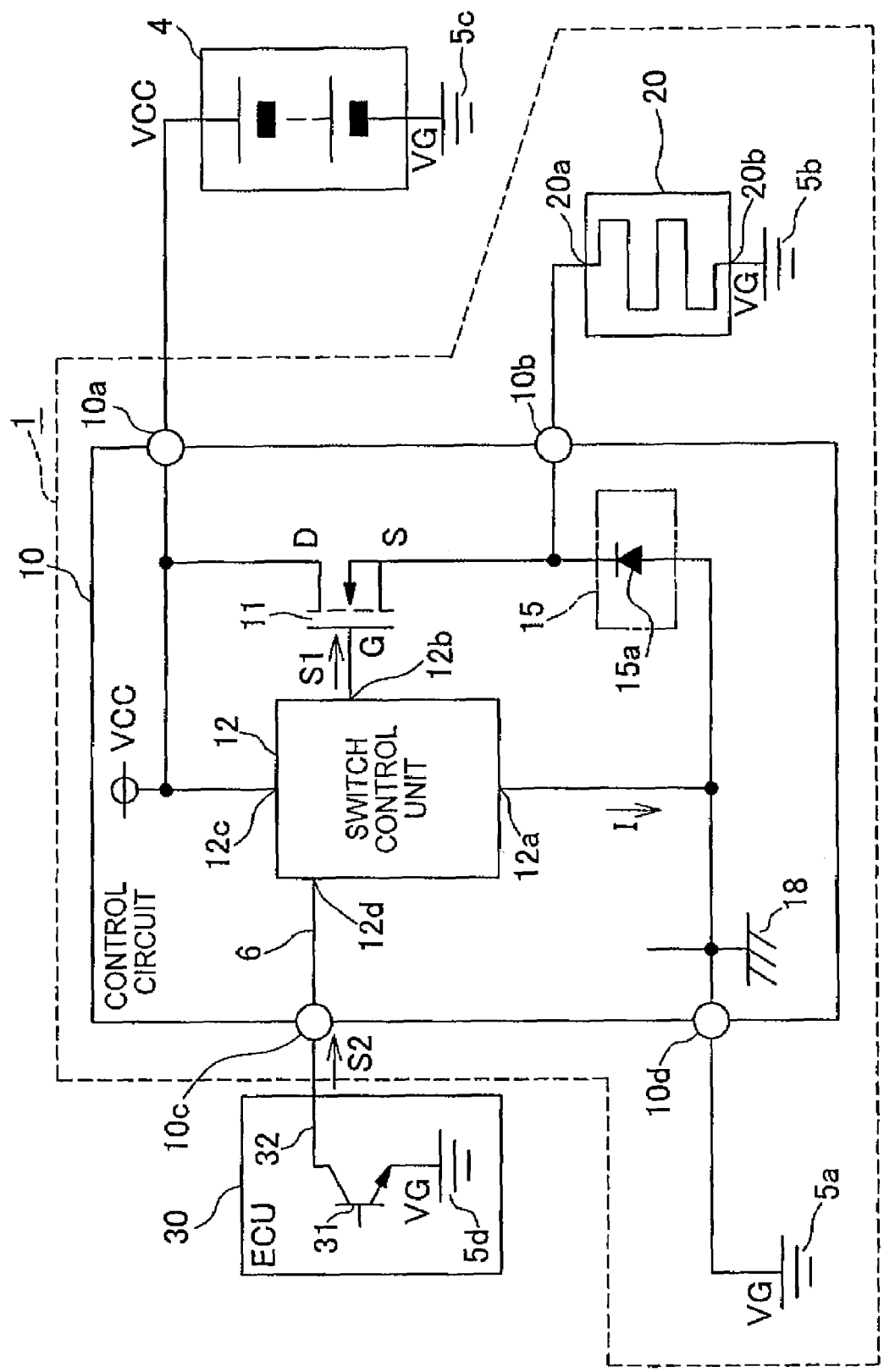
FIG. 1 is a circuit diagram showing first embodiment of a power supply control apparatus of the present invention.

As shown in FIG. 1, a power supply control apparatus 1 is mounted on a vehicle, and controls a power supply against a load of heating wire by a control signal outputted from an electronic control unit. The power supply control apparatus 1 includes a control circuit 10 and a heating wire 20 connected to the control circuit 10.

The control circuit 10 controls connection and disconnection of DC (direct-current) power supply 4 against the heating wire 20. The control circuit 10 has a FET (Field-Effect Transistor) 11, a switch control unit 12, and a bypass device 15. In addition, the control circuit 10 has a power supply terminal 10a, a load terminal 10b, a signal terminal 10c, and an earth terminal 10d. The power supply terminal 10a is connected to the DC power supply 4 including a power supply voltage VCC. The load terminal 10b is connected to the heating wire 20. The signal terminal 10c is connected to a signal wire 32 connecting the control circuit 10 with an electronic control unit 30. The earth terminal 10d is connected to a ground electric potential 5a.

The FET 11 corresponds to a switch element of claims. For example, the FET 11 is applied with an existing N-channel power MOSFET for power supply purpose. A gate terminal (G) is connected to a switch signal terminal 12b, a drain terminal (D) is connected to the power supply terminal 10a, and a source terminal (S) is connected to the load terminal 10b, respectively. According to a switch signal S1 outputted from the switch control unit, the FET 11 switches electrical signals ON/OFF (that is, closed circuit/opened circuit). Thereby, the heating wire 20 is connected or disconnected to the DC power supply 4.

The switch control unit 12 is formed from semiconductor components or IC (Integrated Circuit) such as an operational amplifier or transistor and so on. The switch control unit 12 generates the switch signal S1, and controls ON/OFF of FET 11. Furthermore, the switch control unit 12 has a ground terminal 12a, a switch signal terminal 12b, a power supply terminal 12c of switch control unit 12 (hereafter, the power supply terminal 12c), and an input terminal of request signal for connecting with the power supply 12d (hereafter, the input terminal 12d). The ground terminal 12a is connected to the earth terminal 10d through a common ground 18. The switch signal terminal 12b is connected to the gate (G) of FET 11. The power supply terminal 12c is connected to the power supply terminal 10a. The input terminal 12d is connected to the signal terminal 10c through a control signal wire 6.

when the power supply voltage VCC (for example, 14V) is connected to the power supply terminal 12c, and a ground electric potential VG (for example, 0V) is connected to the ground terminal 12a, the switch control unit 12 is normally powered. However, in a case that a voltage (that is, electric potential) of the power supply terminal 12c or a voltage of the ground terminal 12a is in the allowable range (for example, less than ±1.0V), it is possible to work all right. In addition, when the switch control unit 12 works, a ground current I outputted from the ground terminal 12a is equal to or lower than 20 mA.

The control signal wire 6 is arranged between the signal terminal 10c of control circuit 10 and the request signal input terminal 12d of switch control unit 12, and connected with the signal wire 32 through the signal terminal 10c. The control signal wire 6 inputs a request signal for connecting with the power supply S2 (hereafter, request signal S2), which is outputted from a later-described electronic control unit 30 toward the power supply control apparatus 1 (that is, control circuit 10), into the input terminal 12d of switch control unit 12. In the embodiments of the present invention, the control signal wire 6 is connected to the switch control unit 12 but not limited thereto. The control signal wire 6 can be connected to various parts becoming the ground electric potential VG when the FET 11 is OFF.

The bypass device 15 has a load side diode 15a. The load side diode 15a corresponds to a load side bypass system of claims. An anode terminal of diode 15a is connected to common ground 18 (that is, ground terminal 12a), and a cathode terminal of diode 15a is connected to the load terminal 10b, respectively. In the embodiments of the present invention, the FET 11, the switch control unit 12 and the load side diode 15a are separate parts, but not limited thereto. Those parts can be integrated with IC, and be applied with the control circuit 10.

The heating wire 20 corresponds to load of claims. For example, the heating wire 20 is arranged at rear window of vehicle. The heating wire 20 heats the rear window, and demists. One terminal 20a of heating wire 20 is connected to the DC power supply 4 through the FET 11, and the other terminal 20b of heating wire 20 is connected to the ground electric potential 5b. Furthermore, as the heating wire 20 increases calorific value, a low resistance value (that is, impedance), for example resistance of about 0.7Ω, is used. The heating wire 20 is used in the embodiments of the present invention, but not limited thereto. For example, headlights of vehicle can be used. That is to say, any parts can be used if a voltage of the ground terminal 12a is in the range of allowable voltage for working VR (that is, voltage in which the switch control unit 12 works stably) when the ground current I flows.

The DC power supply 4 is formed with a battery mounted on a vehicle or a DC (Direct-Current)/DC-converter converting a voltage of battery and a direct-current voltage different from the voltage of battery. In addition, the DC power supply 4 is connected to the control circuit 10 and the heating wire 20, and provides the power supply voltage VCC to them. A negative terminal of DC power supply 4 is connected to a ground electric potential 5c.

The electronic control unit 30 is mounted on a vehicle, and controls headlights, an air conditioner, and heating wires of rear wind and so on. According to operation of user, the electric control unit 30 requests connection or disconnection of power supply to the heating wire 20 in the power supply control apparatus 1. The electric control unit 30 has a control unit (not shown), a transistor 31, and the signal wire 32 connected to the transistor 31.

The transistor 31 is a NPN (Negative-Positive-Negative) transistor for small signal. A base terminal of transistor 31 is connected to not shown control unit, a collector terminal of transistor 31 is connected to the signal wire 32, and an emitter terminal of transistor 31 is connected to a ground electric potential 5d.

The signal wire 32 connects electrically the electric control unit 30 and the control circuit 10, and transmits the request signal S2. In particular, the signal wire 32 is formed with a coated conductive wire, which is arranged between the collector terminal of transistor 31 and the signal terminal 10c of control circuit 10, and a connector. Furthermore, the signal wire 32 is connected to a power supply voltage of electric control unit 30 through a pull-up resistor (not shown). When the transistor 31 is ON, the transistor 31 is connected to the ground electric potential 5d. Thereby, the signal wire 32 becomes the ground electric potential VG. On the other hand, when the transistor 31 is OFF, the signal wire 32 is connected to the power supply voltage of electric control unit 30 through the pull-up resistor. Thereby, the signal wire 32 becomes an electric potential of power supply voltage of electric control unit 30 (for example, 14V). That is to say, an electric potential of signal wire 32 becomes the request signal S2. In the embodiments of the present invention, the transistor 31 is used for switching electric potential of signal wire 32, but not limited thereto. For example, a mechanical switch and so on can be used. That is, any parts can be applied if the signal wire 32 can be connected to the ground electric potential VG when connection of power supply is requested.

The request signal S2 requests the power supply connection and disconnection toward the heating wire 20, and is transmitted from the electronic control unit 30 toward the control circuit 10. When the power supply connection is requested, the request signal S2 becomes L-Level (that is, ground electric potential VG). On the other hand, when the disconnection of power supply is requested, the request signal S2 becomes H-Level (that is, electric potential of power supply voltage of electronic control unit 30).

Depending on the request signal S2, the switch signal S1 becomes the power supply voltage VCC or the ground electric potential VG. In particular, when the request signal S2 is the H-Level, the switch signal S1 becomes the ground electric potential VG. Thereby, the FET 11 becomes OFF. On the other hand, when the request signal S2 is the L-Level, the switch signal S1 becomes the power supply voltage VCC. Thereby, the FET 11 becomes ON.

Figure 2:
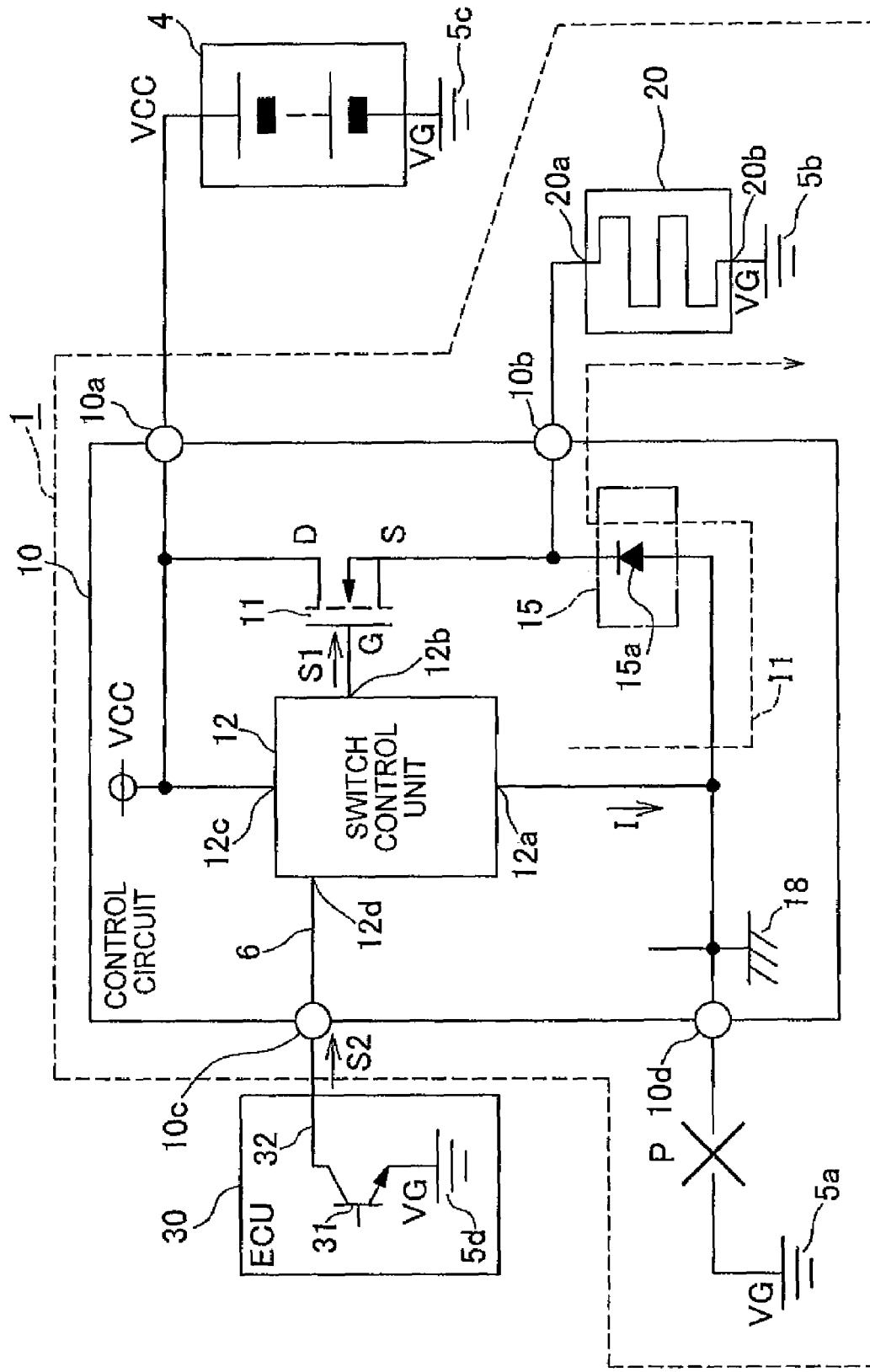
FIG. 2 illustrates that earth connection is disconnected in point P at the power supply control apparatus of FIG. 1.

Next, in the above power supply control apparatus 1, action when connection between the ground terminal 12a of switch control unit 12 and the ground electric potential 5a is disconnected is explained by referring to FIG. 2 as an example.

In the power supply control apparatus 1, in a case that the DC power supply 4 is not connected to the heating wire 20 (that is, when FET 11 is OFF), when connection between the earth terminal 10d and the ground electric potential 5a is disconnected by disconnecting in a point "P" shown in FIG. 2, an electric potential of terminal 20a of heating wire 20 becomes the ground electric potential VG. Thereby, the ground current I of switch control unit 12 flows along a current pathway I1 from the heating wire 20 toward the ground electric potential 5b through the load side diode 15a. A resistance value of heating wire 20 is 0.7Ω, and the ground current I of switch control unit 12 is at the most 20 mA. Thereby, an electric potential of terminal 20a of heating wire 20 becomes 0.014V at a maximum. As a result, the electric potential of ground terminal 12a in the switch control unit 12 is kept within the allowable voltage for working VR (0V±1.0V) even if considering voltage drop of load side diode 15a in a forward direction (generally, about 0.6V). Therefore, the control circuit 10 continues normal action, and maintains condition of power supply disconnection of heating wire 20.

As mentioned above, according to embodiments of the present invention, when the connection between the ground terminal 12a of switch control unit 12 and the ground electric potential 5a is disconnected, the ground terminal 12a of switch control unit 12 is connected to an electric potential in a allowable range for working. Thereby, non-connection condition of ground is not caused in the control circuit 10. Furthermore, it is possible to prevent unstable action of control circuit 10. Therefore, destruction of circuit element or ignition of apparatus can be prevented.

Next, second embodiment of the present invention is explained with reference to FIGS. 3 to 6.

Figure 3:
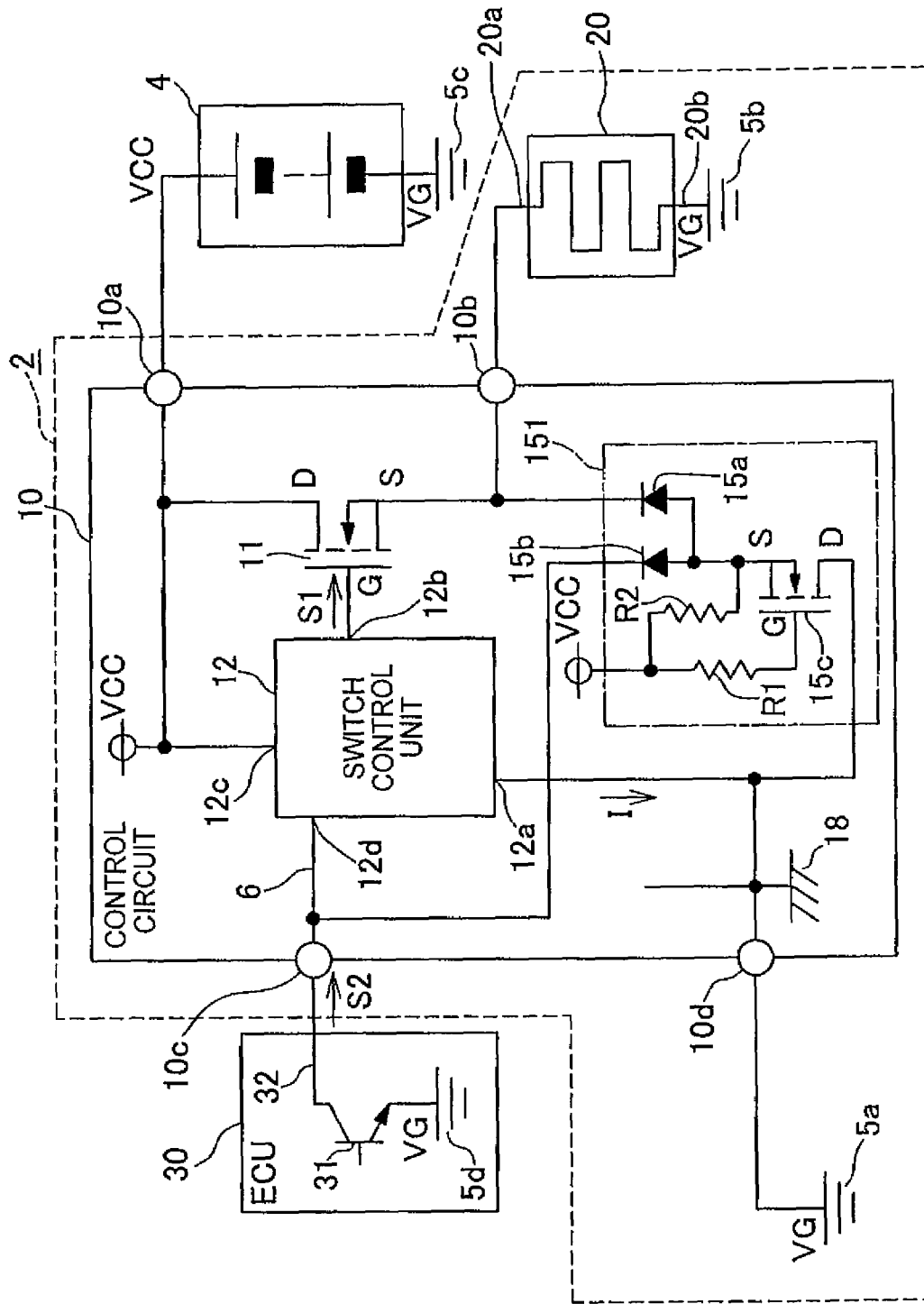
FIG. 3 is a circuit diagram showing second embodiment of the power supply control apparatus of the present invention.

As shown in FIG. 3, a power supply control apparatus 2 is mounted on a vehicle, and controls a power supply against a load of heating wire by a control signal outputted from an electronic control unit. The power supply control apparatus 2 includes the control circuit 10 and the heating wire 20 connected the control circuit 10.

The control circuit 10 controls connection and disconnection of DC (direct-current) power supply 4 against the heating wire 20. The control circuit 10 has the FET 11, the switch control unit 12, and a bypass device 151. In this second embodiment, the same portions are referred to the same reference signs as the first embodiment except the bypass device 151.

The bypass device 151 has the load side diode 15a, a signal side diode 15b, a FET (Field-Effect Transistor) 15c, and fixed resistors R1 and R2.

The load side diode 15a corresponds to a load side bypass system of claims. An anode terminal of load side diode 15a is connected to a source terminal (S) of FET 15c, and a cathode terminal of load side diode 15a is connected to the load terminal 10b, respectively.

The signal side diode 15b corresponds to a signal side bypass system of claims. An anode terminal of signal side diode 15b is connected to the source terminal (S) of FET 15c, and a cathode terminal of signal side diode 15b is connected to the control signal wire 6, respectively.

The FET 15c corresponds to a reverse current preventive system of claims. For example, the FET 15c is applied with an existing N-channel MOSFET which can pass several tens mA (milliampere) of current. A gate terminal (G) of FET 15c is connected to a power supply voltage VCC through the fixed resistor R1 about 20 kΩ to 100 kΩ. A source terminal (S) of FET 15c is connected to the power supply voltage VCC through the fixed resistor R2 about 20 kΩ to 100 kΩ. A drain terminal (D) of FET 15c is connected to the common ground 18 of control circuit 10 (that is, the ground terminal 12a). When the DC power supply 4 is normally connected, the FET 11 is always ON (that is, closed circuit). On the other hand, when the DC power supply 4 is connected in reverse, the FET 11 is always OFF (that is, opened circuit).

Figure 4:
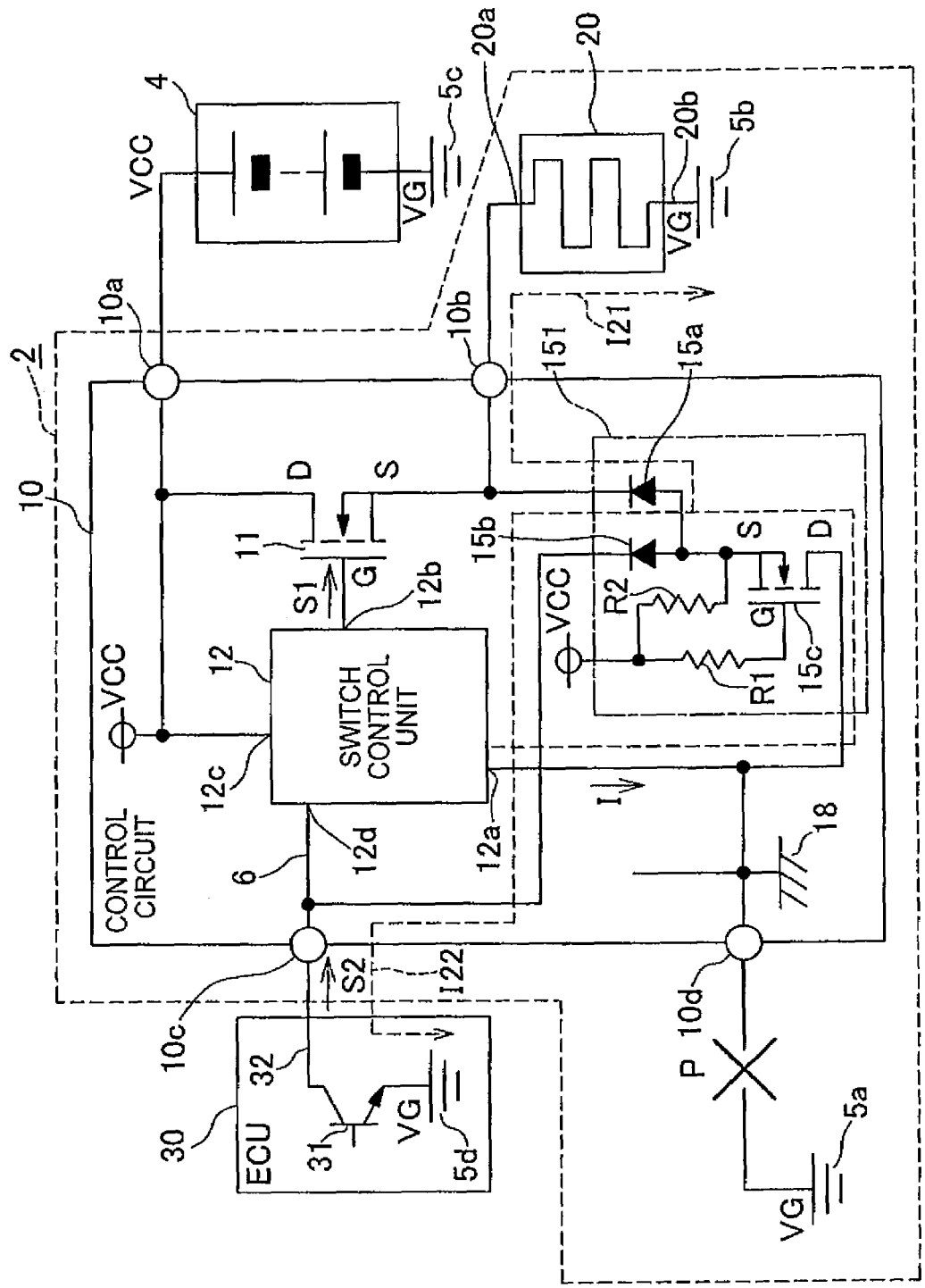
FIG. 4 illustrate that earth connection is disconnected in point P at the power supply control apparatus of FIG. 3.
Figure 5:
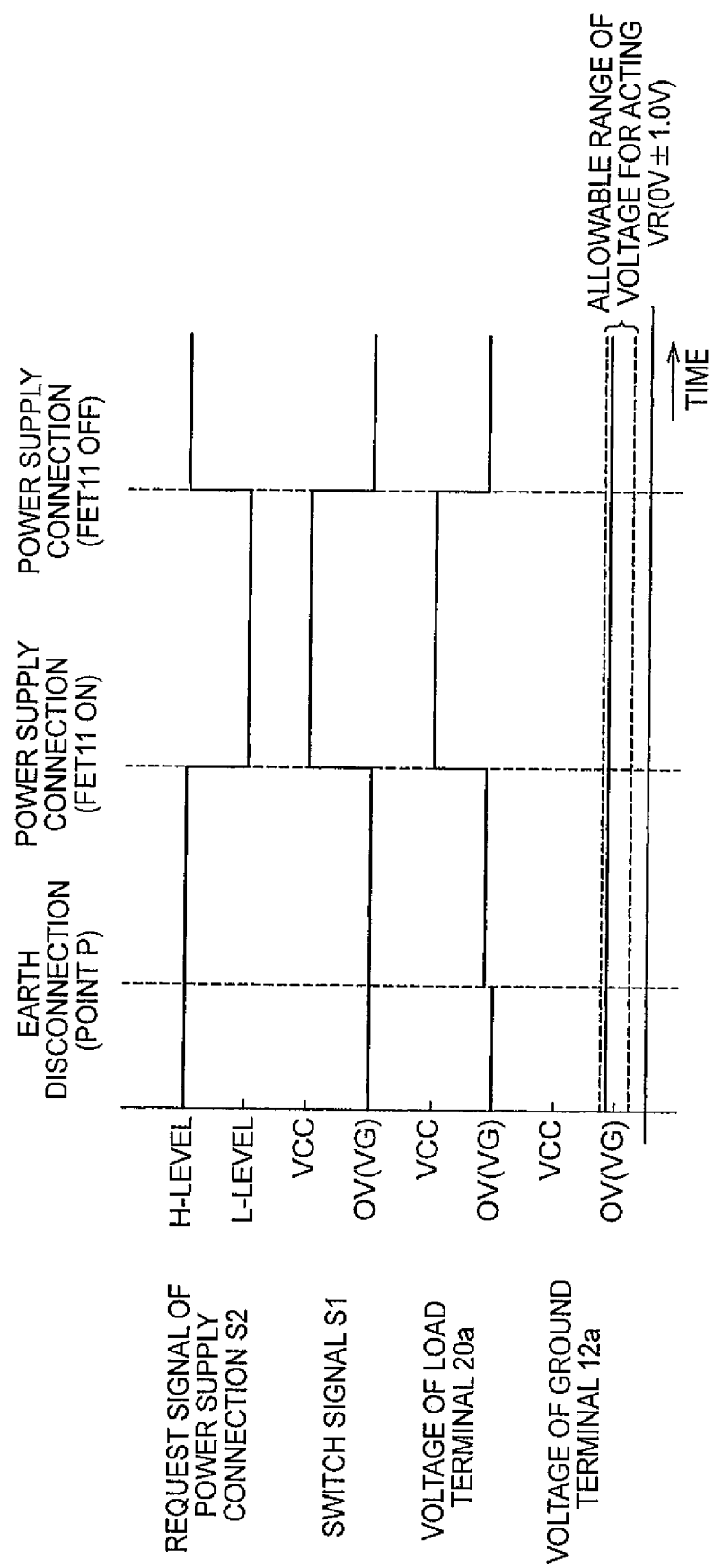
FIG. 5 is a chart showing flow of voltage in each part when the earth connection of point P is disconnected in the power supply control apparatus of FIG. 3.

Next, in the above power supply control apparatus 2, action when connection between the ground terminal 12a of switch control unit 12 and the ground electric potential 5a is disconnected is explained by referring to FIGS. 4 and 5 as an example.

In the power supply control apparatus 2, in a case that the DC power supply 4 is not connected to the heating wire 20 (that is, when request signal S2 is H-Level), when connection between the earth terminal 10b and the ground electric potential 5a is not connected by disconnecting in a point "P" shown in FIG. 4, the electric potential of terminal 20a of heating wire 20 becomes the ground electric potential VG. Thereby, the ground current I of switch control unit 12 flows along a current pathway I21 from the heating wire 20 toward the ground electric potential 5b through the load side diode 15a. A resistance value of heating wire 20 is 0.7Ω, and the ground current I of switch control unit 12 is at the most 20 mA. Thereby, an electric potential of terminal 20a of heating wire 20 becomes 0.014V at a maximum. As a result, the electric potential of ground terminal 12a in the switch control unit 12 is kept within the allowable range of voltage for acting VR (0V±1.0V) even if considering voltage drop of load side diode 15a in a forward direction (generally, about 0.6V). Therefore, the control circuit 10 continues normal action, and maintains condition of power supply disconnection of heating wire 20.

When the power supply connection is requested from the electronic control unit 30 (that is, the request signal S2 is L-Level), the heating wire 20 is connected to the DC power supply 4. As a result, the electric potential of terminal 20a of heating wire 20 becomes the power supply voltage VCC. Therefore, as shown in FIG. 4, the ground current I of switch control unit flows toward a lower electric potential. That is, the ground current I of switch control unit flows along a current pathway I22 from the control signal wire 6 toward the ground electric potential 5d through the signal side diode 15d. In this time, the electric potential of ground terminal 12a of switch control unit 12 is kept within the allowable voltage for working VR even if considering voltage drop of signal side diode 15b in a forward direction (generally, about 0.6V). Therefore, the control circuit 10 continues normal action, and maintains condition of power supply disconnection of heating wire 20.

On the other hand, when power supply disconnection is requested from the electronic control unit 30 (that is, the request signal S2 is the H-Level), the connection between the heating wire 20 and the DC power supply 4 is disconnected. As a result, the electric potential of terminal 20a of heating wire 20 returns to the ground electric potential VG again. Therefore, the ground current I of switch control unit 12 flows toward a lower electric potential. That is, the ground current I of switch control unit flows along a current pathway I21 from the heating wire 20 toward the ground electric potential 5b through the load side diode 15a again. As described above, the electric potential of terminal 12a of switch control unit 12 is kept within the allowable voltage for working VR. Therefore, the control circuit 10 continues normal action, and maintains condition of power supply disconnection of heating wire 20.

Figure 6:
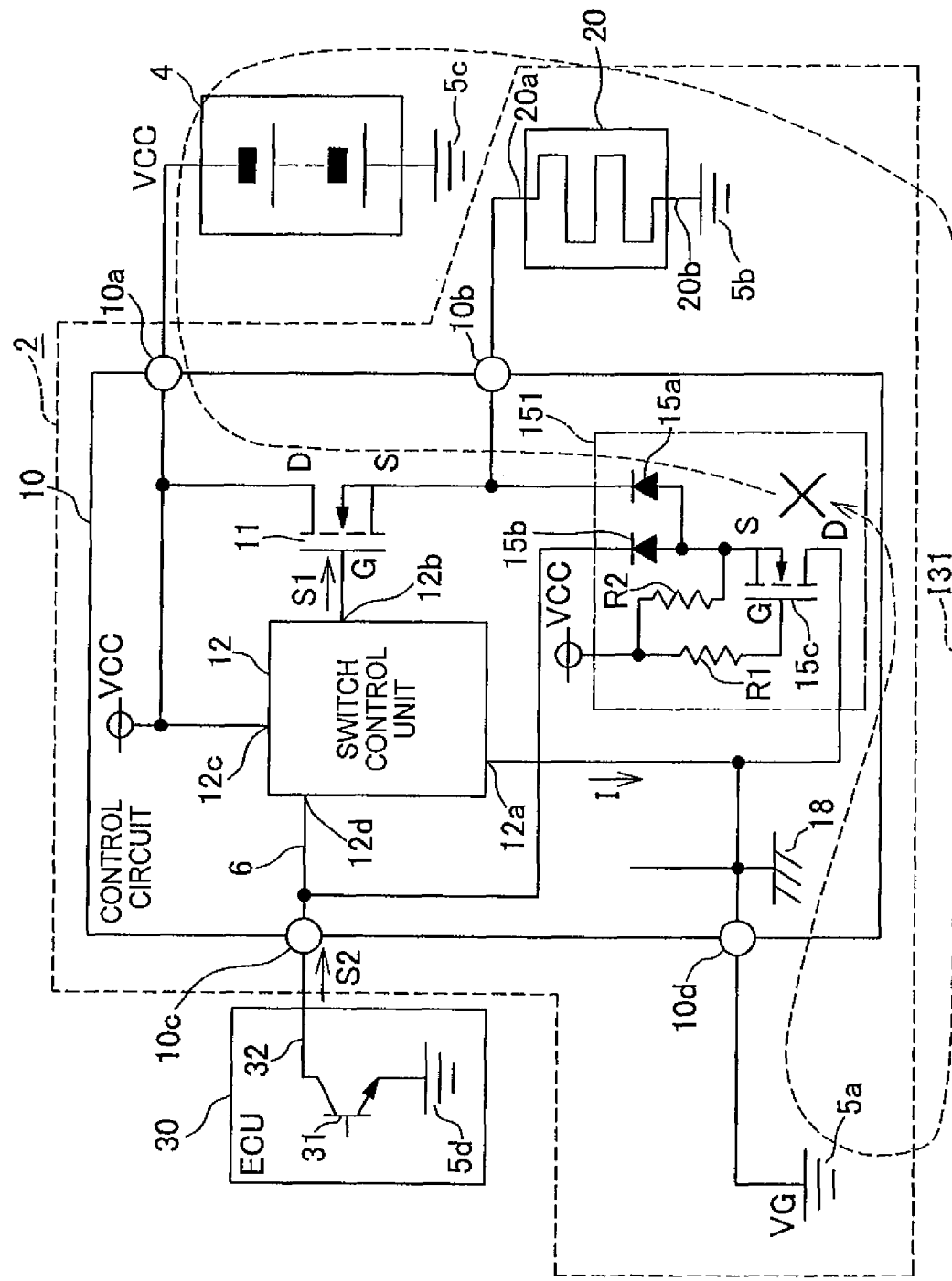
FIG. 6 illustrates action when a DC (Direct-current) power is connected in reverse at the power supply control apparatus of FIG. 3.

Next, in the above mentioned power supply control apparatus 2, action (function) when the DC power supply 4 is connected in reverse is explained with reference to FIG. 6.

In the power supply control apparatus 2, when the DC power supply 4 is normally connected, a positive supply voltage is applied between the gate terminal (G) of FET 15c and the source terminal (S). Thereby, the FET 15c becomes normally ON. However, as shown in FIG. 6, when the DC power supply 4 is connected in reverse, there is not so much of a difference in electric potential between the gate terminal (G) and the source terminal (s). Therefore, the FET 15c is always OFF. For this reason, a short pathway I31 of DC power supply 4 is disconnected by the FET 15c, and generation of pathway which shorts the DC power supply 4 is avoided.

As described above, in the embodiments, when the DC power supply 4 is disconnected to the heating wire 20, the ground terminal 12a of switch control unit 12 is connected to the ground electric potential 5b through the heating wire 20. On the other hand, when the DC power supply 4 is connected to the heating wire 20, the ground terminal 12a of switch control unit 12 is connected to the ground electric potential 5d through the control signal wire 6. Thereby, according to action condition of control circuit 10, the ground terminal 12a of switch control unit 12 can be connected to an electric potential near to a ground electric potential. Consequently, it is possible to prevent unstable action of control circuit 10 more securely. Furthermore, destruction of circuit element or ignition of apparatus can be prevented.

In addition, when the DC power supply 4 is mistakenly connected in reverse by the FET 15c, the short pathway I13 of DC power supply 4 is not formed by virtue of the bypass device 151. Therefore, damage of power supply control apparatus 2 by short can be prevented. Furthermore, more safety power supply control apparatus can be provided.

While, in the embodiment, the present invention is described, it is not limited thereto. Various change and modifications can be made with the scope of the present invention.

What is claimed is:

1. A power supply control apparatus comprising:
    a control circuit having a switch element opening and closing a circuit by a switch signal and a switch control unit outputting the switch signal; and
    a load connecting a first terminal to a DC (direct-current) power supply through the switch element and connecting a second terminal directly to a ground electric potential, wherein the control circuit is not disposed between the second terminal and the ground electric potential,
    the switch control unit having a ground terminal connected to the ground electric potential and outputting a ground current flowing toward the ground electric potential, the control circuit having a bypass device connecting the first terminal of the load to the ground terminal, the bypass device including a load side bypass system for applying the ground current to the ground electric potential through the load when connection between the ground terminal and the ground electric potential is disconnected, the load having impedance for changing the electric potential of the ground terminal into an electric potential in which the switch control unit stably acts when the ground current flows, and the bypass device having a reverse current preventive system configured to always close a circuit so as to apply a current to the load when the bypass device is connected to the load side bypass system in series and the DC power supply is normally connected, and configured to always open the circuit so as to prevent the current from flowing into the load side bypass system when the DC power supply is connected in reverse.

2. The power supply control apparatus as claimed in claim 1, wherein the control circuit has a control signal wire connected to the ground electric potential when the switch element closes, the bypass device has a signal side bypass system for applying the ground current to the ground electric potential through the control signal wire when the connection between the ground terminal and the ground electric potential is disconnected and the switch element closes, and the load side bypass system applies the ground current to the ground electric potential through the load when the connection between the ground terminal and the ground electric potential is disconnected and the switch element opens.

* * * * *